US008089120B2

(12) United States Patent
Tanaka et al.

(10) Patent No.: US 8,089,120 B2
(45) Date of Patent: Jan. 3, 2012

(54) SEMICONDUCTOR MEMORY DEVICE

(75) Inventors: Hiroyasu Tanaka, Tokyo (JP); Masaru Kidoh, Tokyo (JP); Ryota Katsumata, Kanagawa-ken (JP); Masaru Kito, Kanagawa-ken (JP); Yosuke Komori, Kanagawa-ken (JP); Megumi Ishiduki, Kanagawa-ken (JP); Hideaki Aochi, Kanagawa-ken (JP); Yoshiaki Fukuzumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 12/562,781

(22) Filed: Sep. 18, 2009

(65) Prior Publication Data
US 2010/0109071 A1 May 6, 2010

(30) Foreign Application Priority Data

Nov. 4, 2008 (JP) ................................. 2008-282817

(51) Int. Cl.
*H01L 29/792* (2006.01)
*H01L 29/76* (2006.01)
*H01L 29/94* (2006.01)
*H01L 31/062* (2006.01)
*H01L 31/113* (2006.01)
(52) U.S. Cl. ......... 257/324; 257/390; 257/314; 257/328
(58) Field of Classification Search .................. 257/324, 257/331, 202, 390, 379, 3, 314, 326, 329, 257/206, 211, 315, 204, 328, 316, 319
See application file for complete search history.

(56) References Cited

U.S. PATENT DOCUMENTS

| 2005/0133860 | A1* | 6/2005 | Forbes | 257/330 |
| 2007/0252201 | A1 | 11/2007 | Kito et al. | |
| 2008/0173932 | A1* | 7/2008 | Kidoh et al. | 257/324 |

FOREIGN PATENT DOCUMENTS

| JP | 2007-266143 | 10/2007 |
| JP | 2009-146954 | 7/2009 |

\* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

A semiconductor memory device includes: a semiconductor substrate; a stacked body with a plurality of conductive layers and a plurality of dielectric layers alternately stacked, the stacked body being provided on the semiconductor substrate; a semiconductor layer provided inside a hole formed through the stacked body, the semiconductor layer extending in stacking direction of the conductive layers and the dielectric layers; and a charge storage layer provided between the conductive layers and the semiconductor layer. The stacked body in a memory cell array region including a plurality of memory strings is divided into a plurality of blocks by slits with an interlayer dielectric film buried therein, the memory string including as many memory cells series-connected in the stacking direction as the conductive layers, the memory cell including the conductive layer, the semiconductor layer, and the charge storage layer provided between the conductive layer and the semiconductor layer, and each of the block is surrounded by the slits formed in a closed pattern.

20 Claims, 14 Drawing Sheets

A-A CROSS SECTION

B-B CROSS SECTION

SEMICONDUCTOR MEMORY DEVICE

CROSS-REFERENCE TO RELATED APPLICATIONS

This application is based upon and claims the benefit of priority from the prior Japanese Patent Application No. 2008-282817, filed on Nov. 4, 2008; the entire contents of which are incorporated herein by reference.

BACKGROUND OF THE INVENTION

1. Field of the Invention

This invention relates to a semiconductor memory device having a three-dimensional memory cell array structure in which electrode layers are stacked to form memory cells densely arranged in the electrode stacking direction.

2. Background Art

Conventional stacked memory technology is based on the structure of layers stacked by repeating for each layer the process of forming normal, planar memory cells on a silicon substrate. This structure is unsuitable for large capacity because it requires many manufacturing steps per layer. In this context, a technique for increasing the capacity with high manufacturing efficiency is proposed (e.g., JP-A-2007-266143(Kokai)). In this technique, gate electrode layers and interlayer dielectric layers are alternately stacked into a stacked structure. Holes penetrating therethrough from the uppermost layer to the lowermost layer are formed at once, and silicon is buried therein in a pillar shape. In the resulting structure, the silicon pillar is covered with the gate electrode layers at certain intervals. A memory cell transistor is formed by providing a charge storage layer for data retention at the intersection between the gate electrode layer and the silicon pillar.

In such a collectively patterned stacked memory, to separate the memory cell array into a plurality of blocks, the stacked body including the word line electrode layers is divided by slits with an interlayer dielectric film buried therein. Furthermore, for electrical contact to each word line electrode layer, the end portion of the word line electrode layers is patterned into a staircase shape. In this staircase patterning, that is, in etching away the unwanted portion of the word line electrode layers, the word line electrode layer may partly remain beside the slit sidewall under the current process technology. Depending on the slit pattern layout, there is concern about the problem of short circuit between the word line electrode layers of adjacent blocks or regions across the slit through the residual electrode layers beside the slit.

SUMMARY OF THE INVENTION

According to an aspect of the invention, there is provided a semiconductor memory device including: a semiconductor substrate; a stacked body with a plurality of conductive layers and a plurality of dielectric layers alternately stacked, the stacked body being provided on the semiconductor substrate; a semiconductor layer provided inside a hole formed through the stacked body, the semiconductor layer extending in stacking direction of the conductive layers and the dielectric layers; and a charge storage layer provided between the conductive layers and the semiconductor layer, the stacked body in a memory cell array region including a plurality of memory strings being divided into a plurality of blocks by slits with an interlayer dielectric film buried therein, the memory string including as many memory cells series-connected in the stacking direction as the conductive layers, the memory cell including the conductive layer, the semiconductor layer, and the charge storage layer provided between the conductive layer and the semiconductor layer, and each of the block being surrounded by the slits formed in a closed pattern.

DETAILED DESCRIPTION OF THE INVENTION

An embodiment of the invention will now be described with reference to the drawings.

Figure 1:
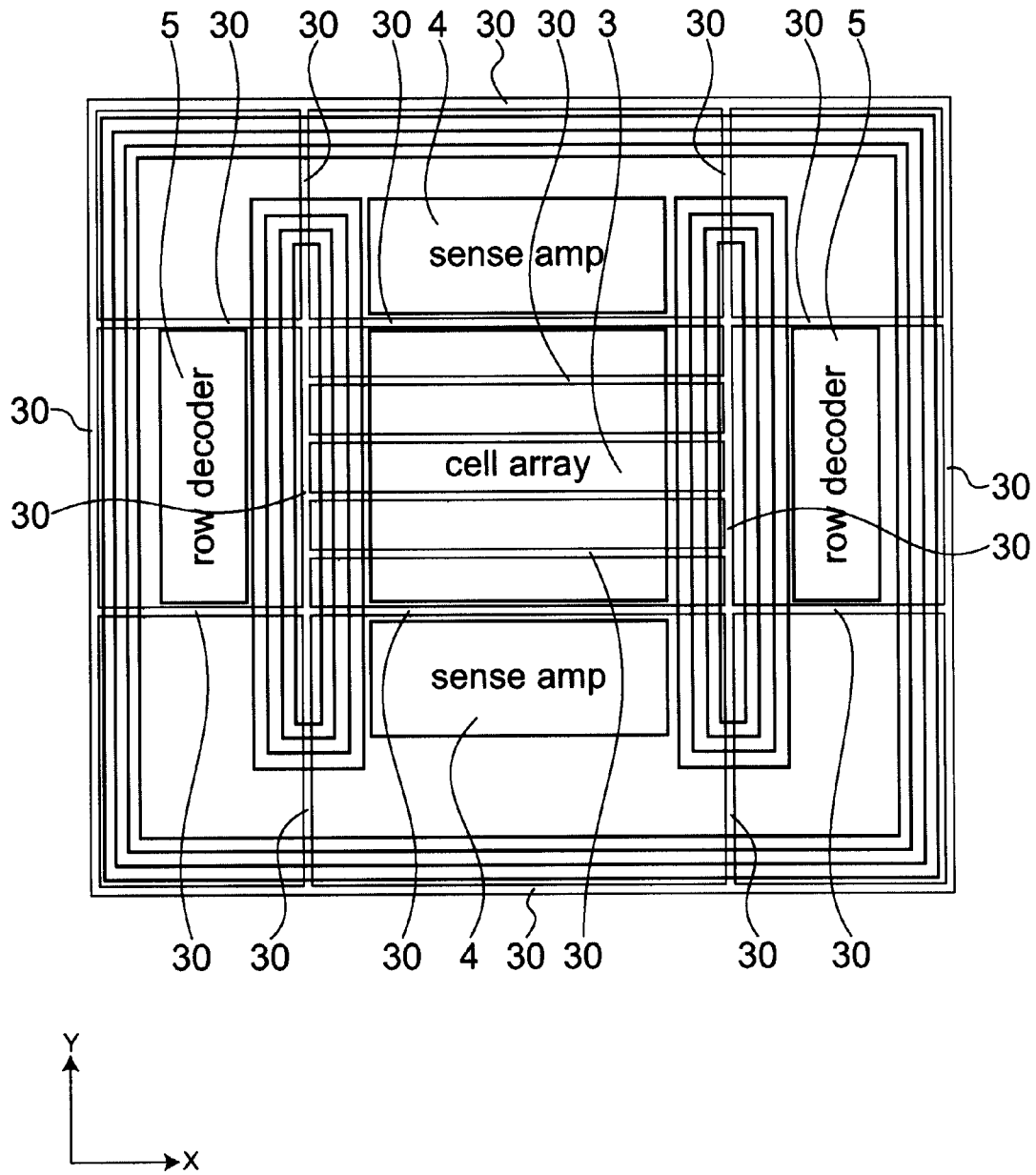
FIG. 1 is a schematic view illustrating the planar layout of major components in a semiconductor memory device according to an embodiment of the invention.

FIG. 1 is a schematic view illustrating the planar layout of major components in a semiconductor memory device according to the embodiment of the invention.

FIG. 1 shows one chip region, which is broadly divided into a memory cell array region and a peripheral circuit region. The memory cell array region is formed at the center of the chip and includes memory cells 3. The peripheral circuit region is formed around the memory cell array region and includes a sense amplifier 4, row decoder 5, and other circuits.

A stacked body with a plurality of conductive layers and a plurality of dielectric layers alternately stacked, described later, is provided throughout the chip including the memory cell array region and the peripheral circuit region. The stacked body is divided by slits 30 into a plurality of blocks. An interlayer dielectric film is buried in the slit 30 as described later.

The component having an independent function, such as the memory cell array 3, sense amplifier 4, and row decoder 5, is surrounded by slits 30 formed in a closed (closed-loop)

pattern. Furthermore, the memory cell array 3 is divided by slits 30 into a plurality of blocks, each of which is also surrounded by slits 30 formed in a closed (closed-loop) pattern.

The memory cell array 3 is composed of a plurality of memory strings arranged in a two-dimensional array. One memory string is composed of a plurality of memory cells series-connected in the stacking direction of the aforementioned stacked body.

In the following, the configuration of the memory cell array in the semiconductor memory device according to this embodiment is described with reference to FIGS. 2 to 5.

Figure 2:
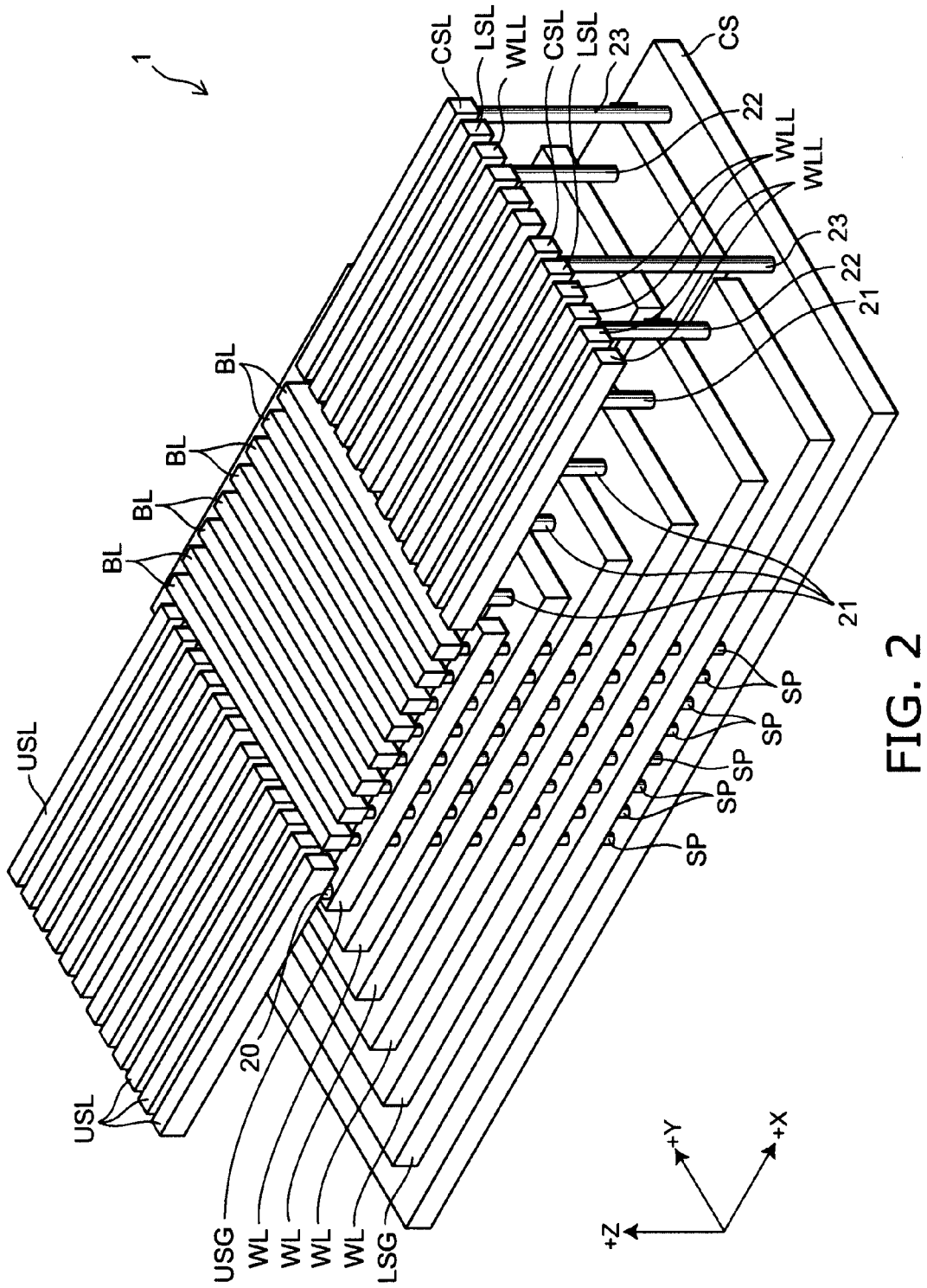
FIG. 2 is a schematic perspective view illustrating the configuration of a memory cell array of the semiconductor memory device.

FIG. 2 is a schematic perspective view illustrating the configuration of the memory cell array.

Figure 3:
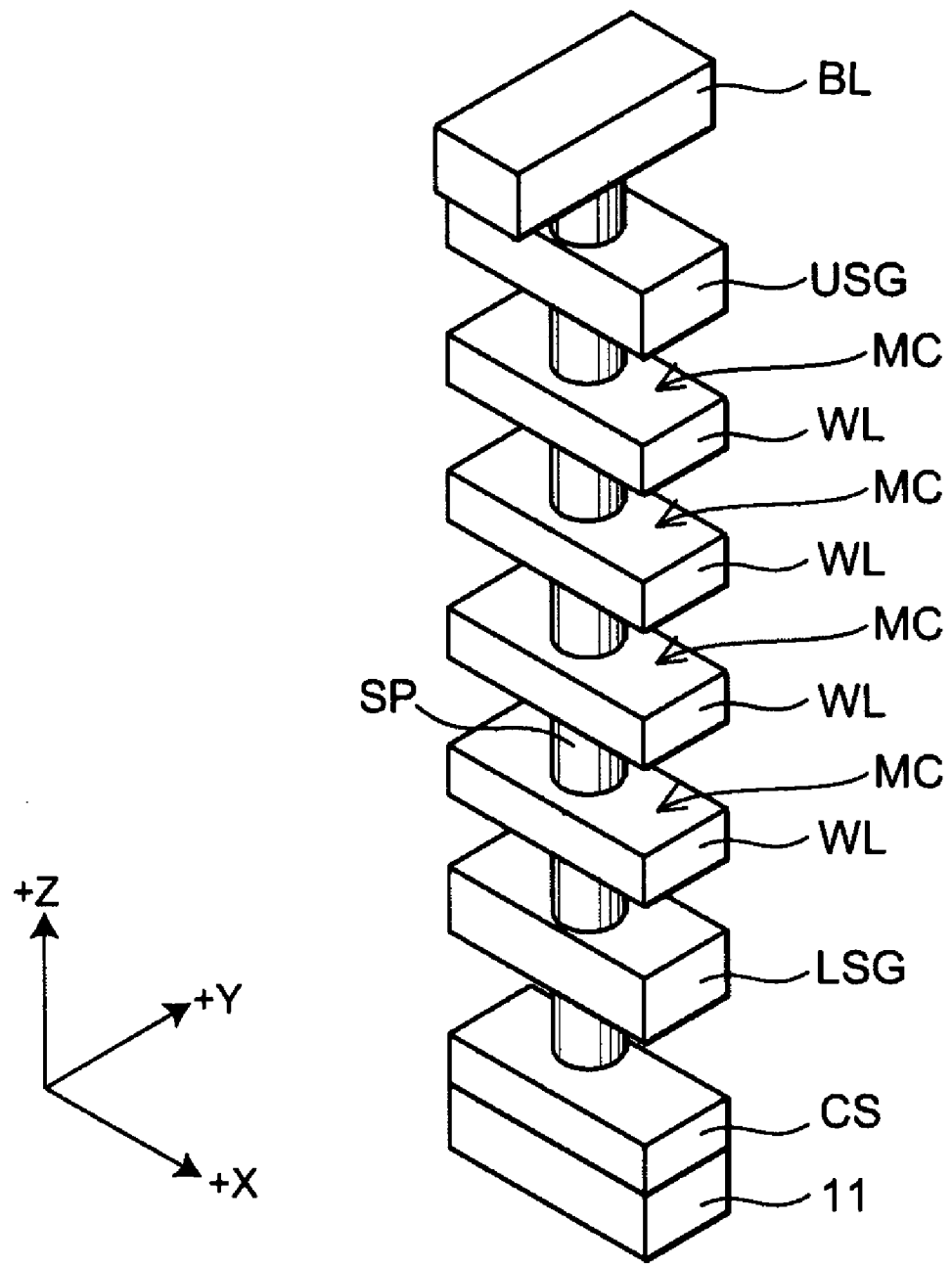
FIG. 3 is a schematic perspective view of one memory string of the memory cell array in FIG. 2.

FIG. 3 is a schematic perspective view of one memory string.

Figure 4:
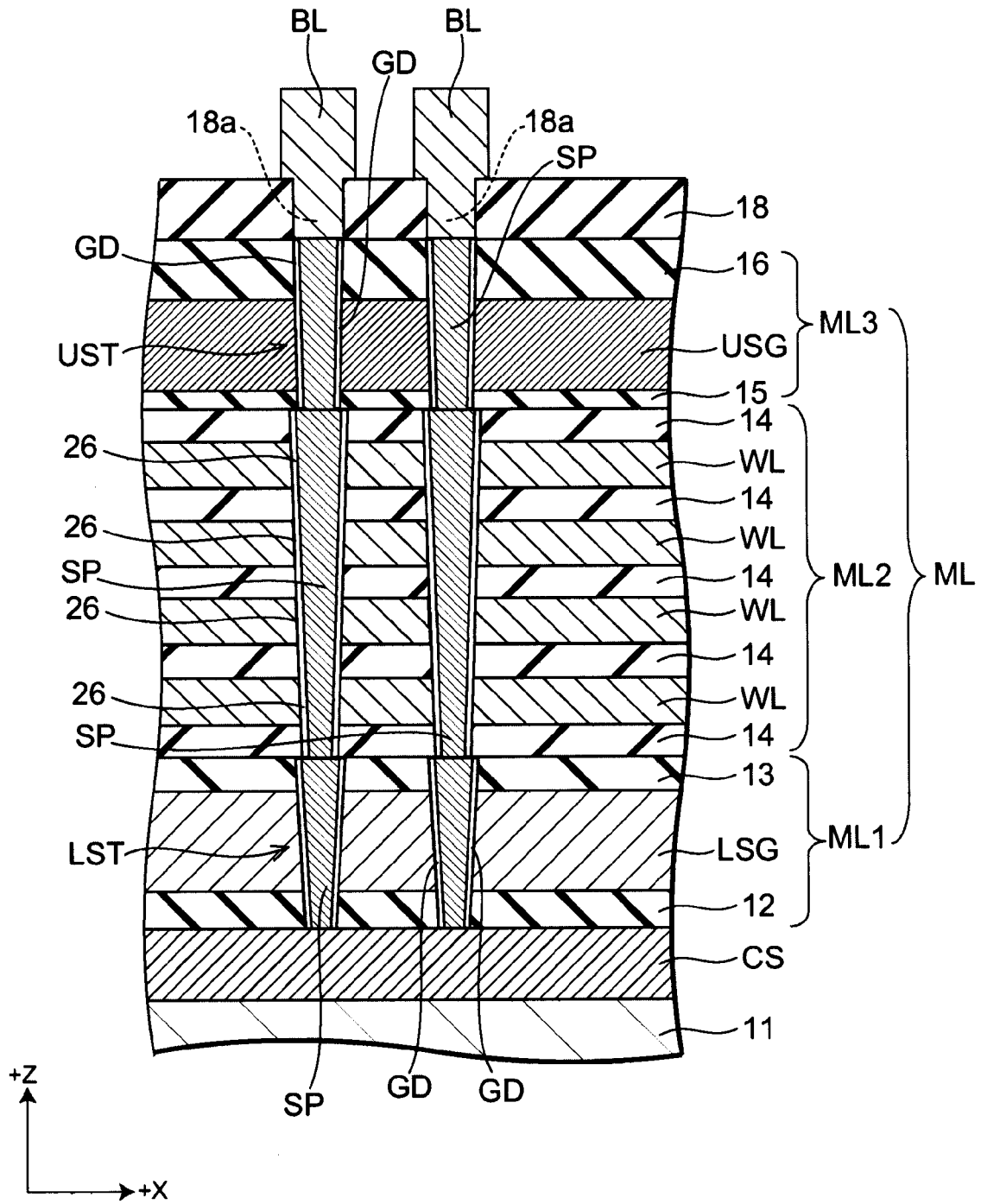
FIG. 4 is a schematic cross-sectional view of the relevant part in the XZ direction in FIG. 2.

FIG. 4 is a schematic cross-sectional view of the relevant part in the XZ direction in FIG. 2.

Figure 5:
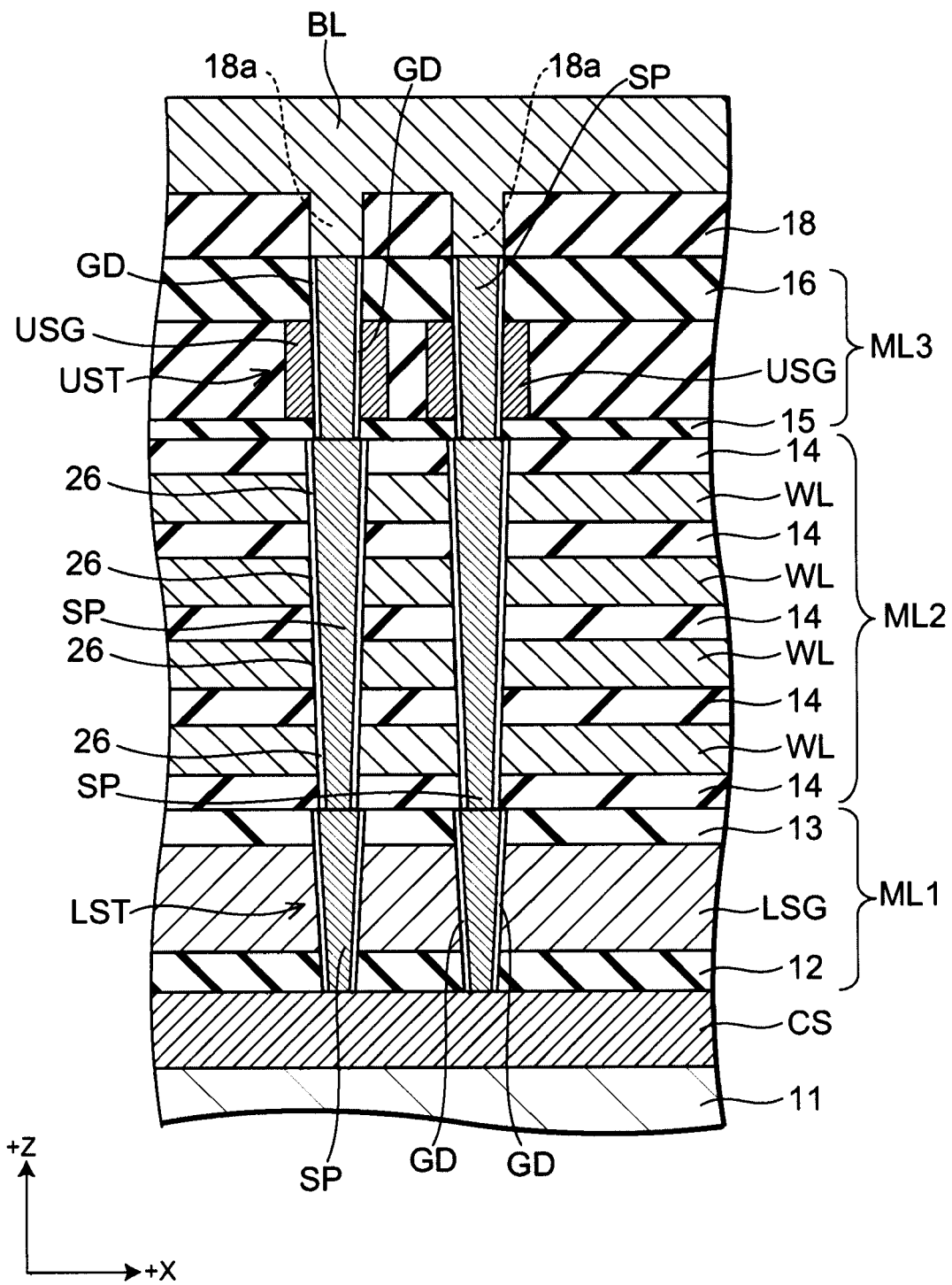
FIG. 5 is a schematic cross-sectional view of the relevant part in the YZ direction in FIG. 2.

FIG. 5 is a schematic cross-sectional view of the relevant part in the YZ direction in FIG. 2.

In FIGS. 2 and 3, for clarity of illustration, only the conductive portions are shown, and the dielectric portions are not shown.

The semiconductor memory device according to this embodiment has a structure in which semiconductor layers, dielectric layers, conductive layers, interconnects and the like are formed on a semiconductor substrate. Although the semiconductor is illustratively silicon in this embodiment, other semiconductors can also be used.

As shown in FIGS. 4 and 5, a cell source CS is provided on the silicon substrate 11. The cell source CS is illustratively a silicon layer whose resistance is decreased by impurity doping at relatively high concentration. On the cell source CS is provided a dielectric layer 12, a lower select gate LSG is provided thereon, and a dielectric layer 13 is provided thereon. The dielectric layers 12, 13 are illustratively silicon oxide layers, and the lower select gate LSG is illustratively a silicon layer. The dielectric layer 12, the lower select gate LSG, and the dielectric layer 13 constitute a stacked body ML1. Here, the dielectric layer 13 is not necessarily needed.

On the stacked body ML1 is provided a stacked body ML2 in which a plurality of dielectric layers 14 illustratively made of silicon oxide and a plurality of conductive layers WL illustratively made of amorphous or polycrystalline silicon are alternately stacked.

The conductive layer WL in the memory cell array functions as a word line electrode layer. The dielectric layer 14 is provided above, below, and between the conductive layers WL, and functions as an interlayer dielectric layer for insulating between the conductive layers WL. The number of conductive layers WL is arbitrary, and illustratively four in this embodiment.

On the stacked body ML2 is provided a dielectric layer 15, an upper select gate USG is provided thereon, and a dielectric layer 16 is provided thereon. The dielectric layers 15, 16 are illustratively silicon oxide layers, and the upper select gate USG is illustratively a silicon layer. The dielectric layer 15, the upper select gate USG, and the dielectric layer 16 constitute a stacked body ML3. Here, the dielectric layer 16 is not necessarily needed.

In the following, in this specification, an XYZ orthogonal coordinate system is introduced for convenience of description. In this coordinate system, the two directions parallel to the upper surface (major surface) of the silicon substrate 11 and orthogonal to each other are referred to as the X and Y direction, and the direction orthogonal to both the X and Y direction, that is, the stacking direction of the dielectric layers 14 and the conductive layers WL, is referred to as the Z direction.

The stacked body ML1, the stacked body ML2, and the stacked body ML3 (hereinafter also collectively referred to as "stacked body ML") are divided by the aforementioned slits 30 into a plurality of blocks along the Y direction.

The upper select gate USG is formed by dividing one plate-like conductive layer (such as a silicon layer) along the Y direction into a plurality of wiring-like conductive members extending in the X direction.

The conductive layer WL and the lower select gate LSG are formed like a plate parallel to the XY plane. Alternatively, the lower select gate LSG can be divided into a plurality of members like the upper select gate USG. The cell source CS is a single plate-like conductive layer parallel to the XY plane so as to connect the immediately underlying regions of the plurality of blocks of the stacked body ML.

The stacked body ML includes a plurality of through holes extending in the stacking direction (Z direction) entirely through the stacked body ML. The plurality of through holes are arranged in a matrix along the X and Y direction, for instance.

Inside each through hole, a silicon pillar SP is buried as a pillar-shaped semiconductor layer. The silicon pillar SP is formed from polycrystalline silicon or amorphous silicon. The silicon pillar SP is shaped like a pillar, such as a cylinder, extending in the Z direction. The silicon pillar SP is provided throughout the stacked body ML in the stacking direction, and its lower end portion is connected to the cell source CS.

A dielectric layer 18 (see FIGS. 4 and 5) is provided on the stacked body ML3, and a plurality of bit lines BL extending in the Y direction are provided on the dielectric layer 18. The bit line BL is illustratively formed from a metal material. "Metal" referred to herein also includes alloys as well as pure metals.

Each bit line BL is arranged so as to pass immediately above a corresponding sequence of silicon pillars SP arranged along the Y direction, and is connected to the upper end portion of the silicon pillar SP through a via hole 18a formed in the dielectric layer 18. That is, the silicon pillars SP in each sequence arranged in the Y direction are connected to a different bit line BL. Each silicon pillar SP is connected between the bit line BL and the cell source CS.

As shown in FIG. 2, the upper select gate USG is connected through a via 20 to an upper select gate interconnect USL illustratively formed from a metal material.

For each block of the stacked body ML, a plurality of word lines WLL, one lower select gate interconnect LSL, and one cell source interconnect CSL are provided. The word line WLL, the lower select gate interconnect LSL, and the cell source interconnect CSL are illustratively formed from a metal material.

The number of word lines WLL associated with one stacked body block is equal to the number of conductive layers WL. Each word line WLL is connected through a via 21 to the end portion of a corresponding one of the staircase-shaped conductive layers WL. The lower select gate interconnect LSL is connected through a via 22 to the lower select gate LSG, and the cell source interconnect CSL is connected through a contact 23 to the cell source CS. The interconnects are insulated from each other by an interlayer dielectric film, not shown.

On the inner peripheral wall of the hole formed in the stacked body ML2 made of the stacked structure of the conductive layers WL and the dielectric layers 14 is formed a structure in which a charge storage layer 26 is sandwiched between a first dielectric film and a second dielectric film (only the charge storage layer 26 is shown in FIGS. 4 and 5). These films are formed in a tubular shape on the inner peripheral wall of the hole.

The silicon pillar SP is buried inside the second dielectric film, and the second dielectric film is in contact with the silicon pillar SP. The first dielectric film is provided in contact with the conductive layers WL, and the charge storage layer 26 is provided between the first dielectric film and the second dielectric film.

The silicon pillar SP provided in the stacked body ML2 functions as a channel, the conductive layer WL functions as a control gate, and the charge storage layer 26 functions as a data memory layer for storing charges injected from the silicon pillar SP. That is, at the intersection between the silicon pillar SP and each conductive layer WL is formed a memory cell having a structure in which a channel is surrounded by a gate electrode.

The memory cell has a charge trap structure. The charge storage layer 26 includes numerous traps operable to confine charges (electrons), and is illustratively made of a silicon nitride film. The second dielectric film is illustratively made of a silicon oxide film and serves as a potential barrier when a charge is injected from the silicon pillar SP into the charge storage layer 26 or when a charge stored in the charge storage layer 26 diffuses into the silicon pillar SP. The first dielectric film is illustratively made of a silicon oxide film and prevents charges stored in the charge storage layer 26 from diffusing into the conductive layer WL which functions as a gate electrode.

Downscaling of the memory cell having the aforementioned structure allows normal write/read operation to be performed without diffusion layers serving as source/drain regions. Hence, in this embodiment, the memory cell includes no diffusion layer serving as a source/drain region having a different conductivity type in the silicon pillar SP. That is, the silicon pillar SP functions as a channel region, source region, and drain region in the memory cell. Furthermore, the OFF state is realized by controlling the voltage applied to the conductive layer WL to substantially deplete the silicon pillar SP opposed to the conductive layer WL.

As shown in FIG. 3, as many memory cells MC as the conductive layers WL are series connected in the Z direction around one silicon pillar SP to constitute one memory string. Such memory strings are arranged in a matrix in the X and Y direction, and thereby a plurality of memory cells are three-dimensionally arranged in the X, Y, and Z direction.

Referring again to FIGS. 4 and 5, on the inner peripheral wall of the through hole formed in the stacked body ML1 below the stacked body ML2, a gate dielectric film GD is formed in a tubular shape, and the silicon pillar SP is buried therein. Thus, the stacked body ML1 includes a lower select transistor LST with the silicon pillar SP serving as a channel and the lower select gate LSG therearound serving as a gate electrode.

Furthermore, on the inner peripheral wall of the through hole formed in the stacked body ML3 above the stacked body ML2, a gate dielectric film GD is formed in a tubular shape, and the silicon pillar SP is buried therein. Thus, the stacked body ML3 includes an upper select transistor UST with the silicon pillar SP serving as a channel and the upper select gate USG therearound serving as a gate electrode.

The lower select transistor LST and the upper select transistor UST have a structure in which a channel is surrounded by a gate electrode, like the aforementioned memory cell. However, they do not function as memory cells, but serves to select a silicon pillar SP.

Furthermore, the semiconductor memory device according to this embodiment includes a driver circuit for applying a potential to the upper end portion of the silicon pillar SP through the bit line BL, a driver circuit for applying a potential to the lower end portion of the silicon pillar SP through the cell source interconnect CSL, the contact 23, and the cell source CS, a driver circuit for applying a potential to the upper select gate USG through the upper select gate interconnect USL and the via 20, a driver circuit for applying a potential to the lower select gate LSG through the lower select gate interconnect LSL and the via 22, and a driver circuit (corresponding to the row decoder 5 shown in FIG. 1) for applying a potential to each conductive layer WL through the word line WLL and the via 21. These driver circuits are formed in the peripheral circuit region shown in FIG. 1. The peripheral circuit region includes P-wells and N-wells (not shown), in which transistors and other elements are formed.

The semiconductor memory device according to this embodiment is a nonvolatile semiconductor memory device allowing data to be erased and written electrically and freely, and being capable of retaining its memory content even when powered off.

The X coordinate of a memory cell is selected by selecting a bit line BL, the Y coordinate of the memory cell is selected by selecting an upper select gate USG to turn the upper select transistor UST to the conducting or non-conducting state, and the Z coordinate of the memory cell is selected by using the row decoder 5 to select a conductive layer WL serving as a word line. Then, information is stored by injecting electrons into the charge storage layer 26 of the selected memory cell. The data stored in the memory cell is read by passing a sense current in the silicon pillar SP which passes through the memory cell.

Next, a method for manufacturing the semiconductor memory device according to this embodiment is described with reference to FIGS. 6 to 8 in addition to FIGS. 4 and 5 described above. FIGS. 6 to 8 show a method for manufacturing the memory cell array. In FIGS. 6 to 8, only the conductive portions are shown, and the dielectric portions are not shown.

Figure 6A:
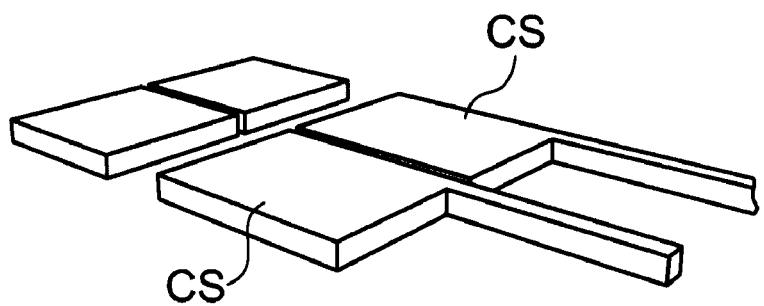
FIGS. 6A to 6C are schematic views illustrating a method for manufacturing the semiconductor memory device according to the embodiment of the invention.

After a cell source CS is formed on a silicon substrate 11 (FIGS. 4 and 5), as shown in FIG. 6A, an element isolation trench having an STI (shallow trench isolation) structure, for instance, is formed. A dielectric film is buried in the element isolation trench.

Figure 6B:
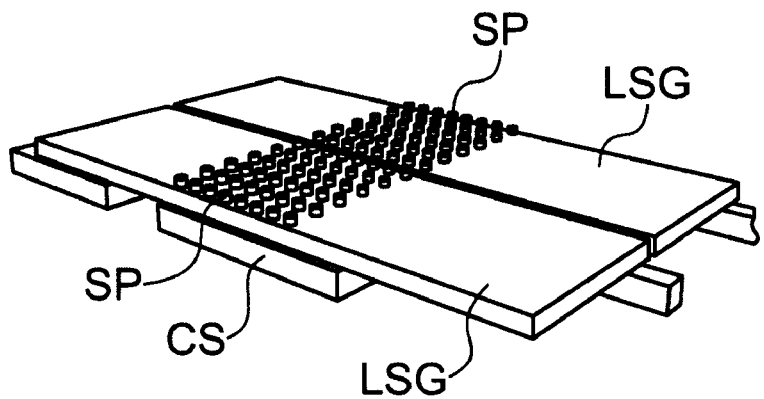

Next, as shown in FIG. 6B, a silicon layer constituting a lower select gate LSG is formed via a dielectric layer above the cell source CS, and a dielectric layer is formed further thereon. Thus, the stacked body ML1 shown in FIGS. 4 and 5 is obtained. Simultaneously, P-wells, N-wells and the like are formed in the peripheral circuit region, the gates of transistors constituting driver circuits (such as a sense amplifier 4 and row decoder 5) are formed, and their sources/drains are formed.

Next, in the stacked body ML1, through holes extending in the Z direction (stacking direction) to the cell source CS are etched, and then a dielectric film, such as a silicon oxide film and a silicon nitride film, is deposited entirely on the stacked body ML1. The dielectric film is formed on the bottom surface and side surface of the through hole in addition to the upper surface of the stacked body ML1. Then, the dielectric film formed on the upper surface of the stacked body ML1 and the bottom surface of the through hole is removed illustratively by RIE (reactive ion etching). Thus, the dielectric film remains on the side surface of the through hole to serve as a gate dielectric film GD (FIGS. 4 and 5). Next, silicon is buried inside the through hole to form a silicon pillar SP in the through hole. Thus, a lower select transistor LST is formed.

Figure 6C:
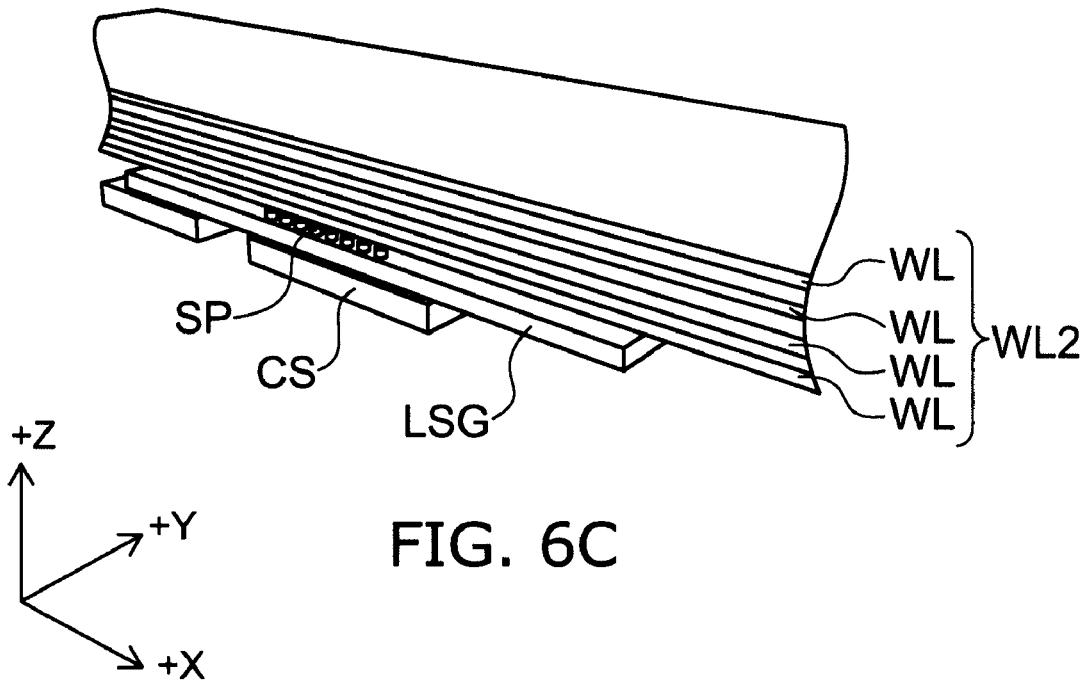

Next, as shown in FIGS. 4, 5, and 6C, on the stacked body ML1, dielectric films 14 illustratively made of TEOS (tetraethoxysilane) and conductive layers WL illustratively made of amorphous or polycrystalline silicon are alternately stacked to form a stacked body ML2.

Next, holes penetrating through the stacked body ML2 of the dielectric films 14 and the conductive layers WL and extending in the stacking direction thereof are formed by RIE (reactive ion etching). The hole is formed immediately above the silicon pillar SP of the underlying stacked body ML1 so as to reach that silicon pillar SP.

After the aforementioned holes are formed, a dielectric film illustratively having an ONO (oxide-nitride-oxide) structure including a charge storage layer 26 (this dielectric film being hereinafter simply referred to as ONO film) is formed. The ONO film is formed on the bottom surface and side surface of the hole in addition to the upper surface of the stacked body ML2.

Next, the ONO film formed on the upper surface of the stacked body ML2 and the bottom surface of the hole is removed. Thus, the ONO film is left only on the side surface of the hole.

Figure 7A:
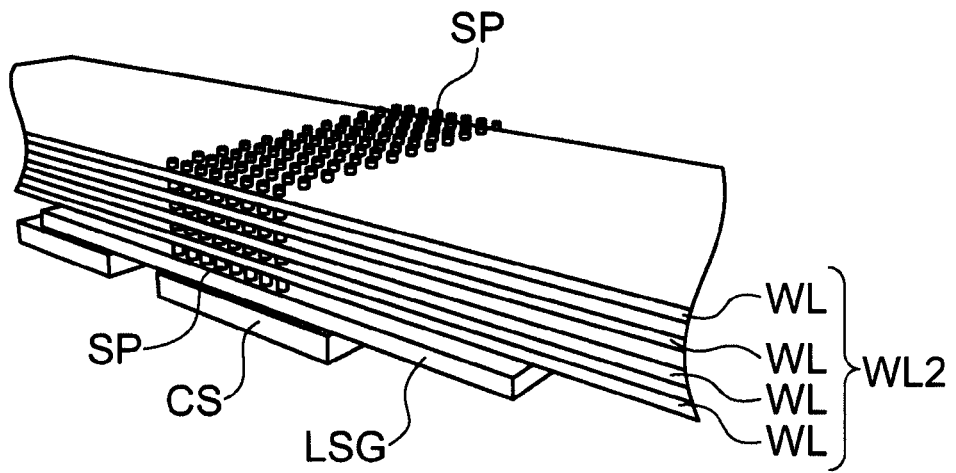
FIGS. 7A and 7B are schematic views showing processes continuing from FIG. 6B.

Then, silicon is buried inside the hole to form a silicon pillar SP in the stacked body ML2 (FIG. 7A). Thus, a memory cell is formed at the intersection between the silicon pillar SP and each conductive layer WL. The lower end of the silicon pillar SP of the stacked body ML2 is in contact with the upper end of the silicon pillar SP of the stacked body ML1.

Figure 7B:
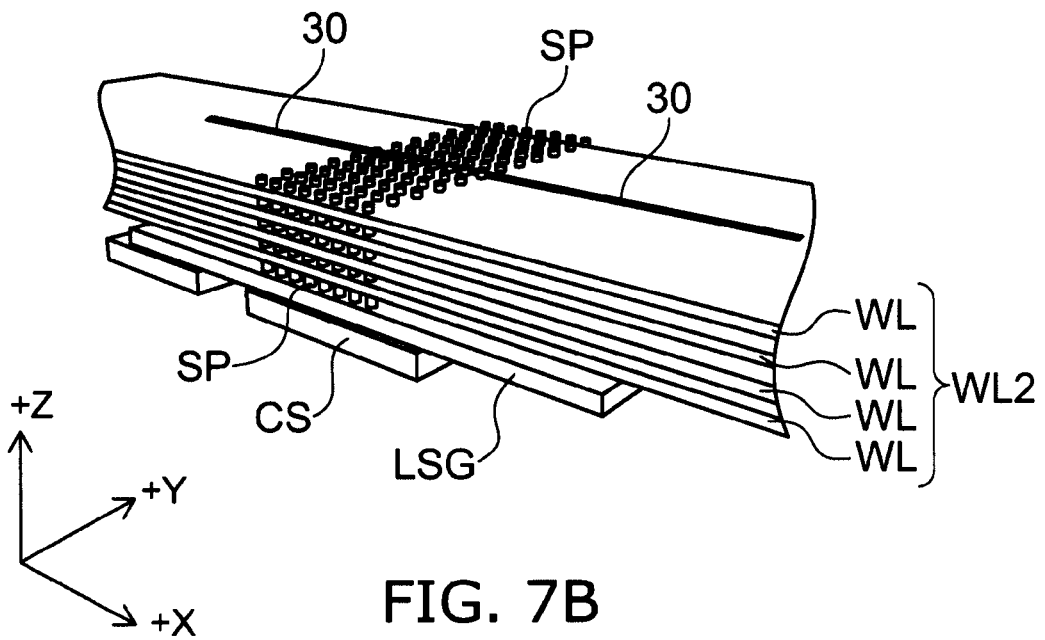

Next, for the purpose of dividing the memory cell array into a plurality of blocks, as shown in FIG. 7B, a slit 30 is formed to divide the stacked body ML2. This slit 30 is formed illustratively by RIE (reactive ion etching). This slit 30 divides the memory cell array into a plurality of blocks in the Y direction. Erasure of data, for instance, is collectively performed for each block.

Figure 9A:
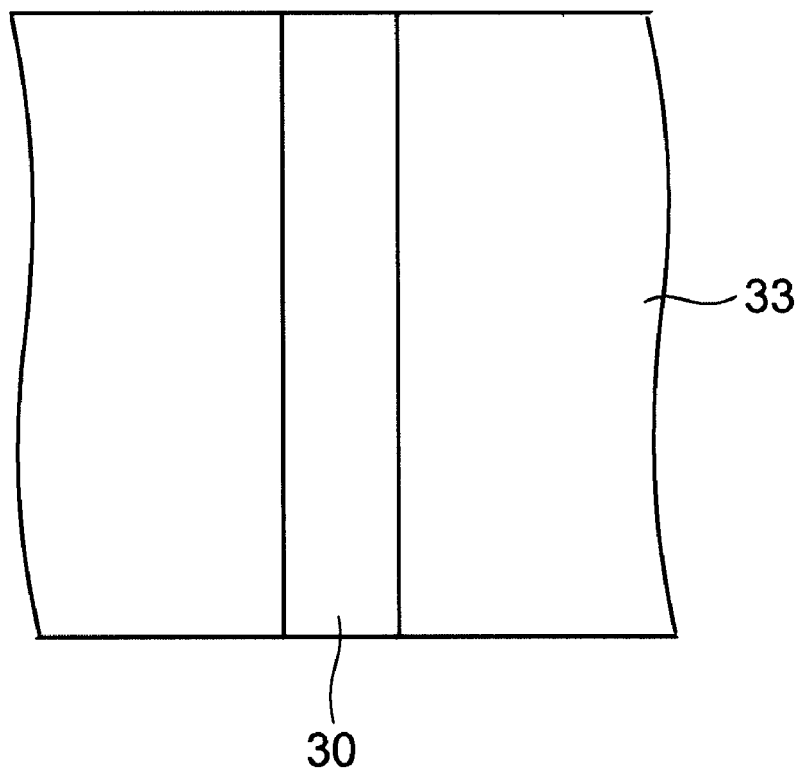
FIGS. 9A and 9B are schematic views of the slit formation portion in FIG. 7B.
Figure 9B:
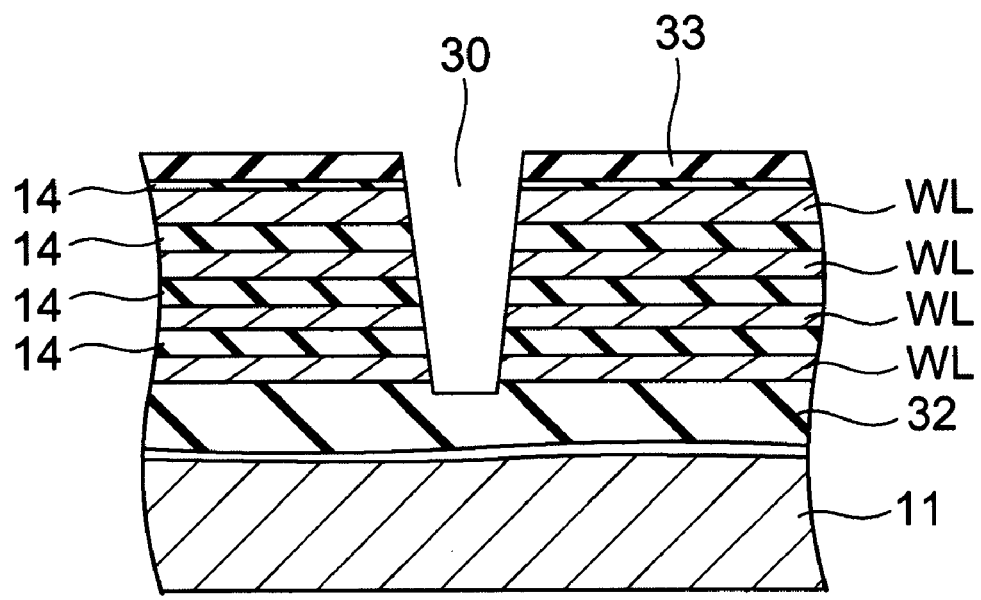

FIG. 9A is an enlarged schematic plan view of the slit formation portion, and FIG. 9B is a cross-sectional view of that portion. Before the slit 30 is formed, a silicon nitride film 33 is formed in advance on top of the stacked body ML2. In FIG. 9B, the lower select transistor LST shown in FIGS. 4 and 5 is not shown, and the dielectric layer on the lower select transistor LST is shown as a dielectric layer 32.

Figure 10A:
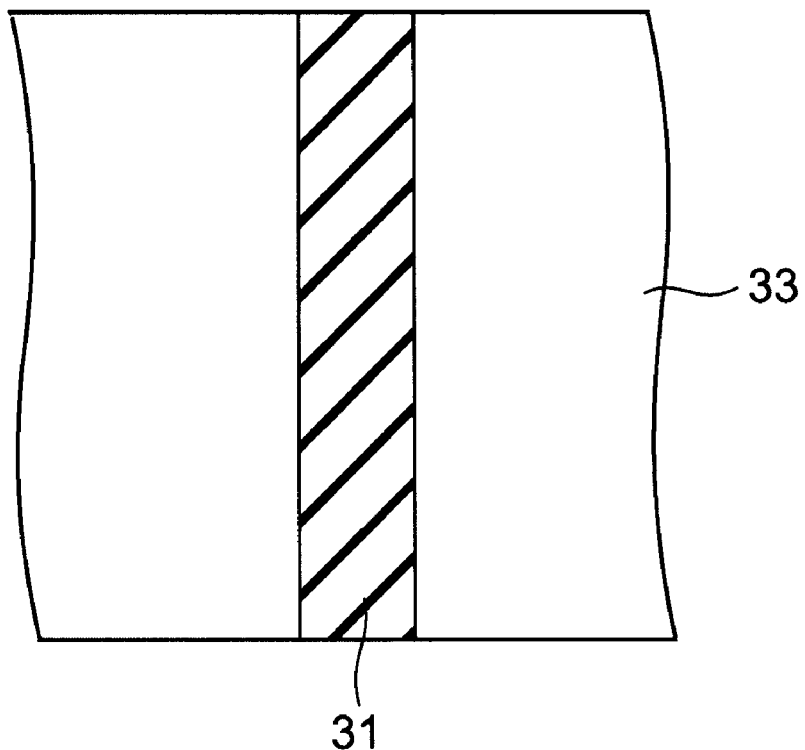
FIGS. 10A and 10B are schematic views of the state of an interlayer dielectric film buried in the slit shown in FIGS. 9A and 9B.
Figure 10B:
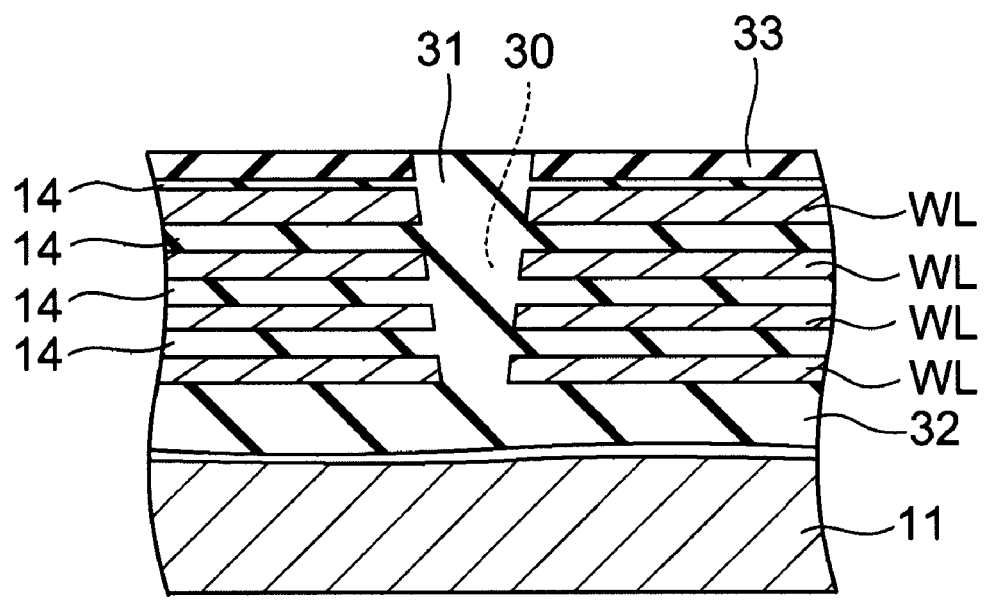

After the slit 30 is formed, an interlayer dielectric film 31 is buried in the slit 30 as shown in FIG. 10. FIGS. 10A and 10B show the states after burying of the interlayer dielectric film 31, corresponding to FIGS. 9A and 9B, respectively. Specifically, a silicon oxide film is deposited on the stacked body including inside the slit 30, and then planarized by CMP (chemical mechanical polishing) using the silicon nitride film 33 on top of the stacked body as a stopper. Thus, the structure of FIG. 10B is obtained.

Figure 8A:
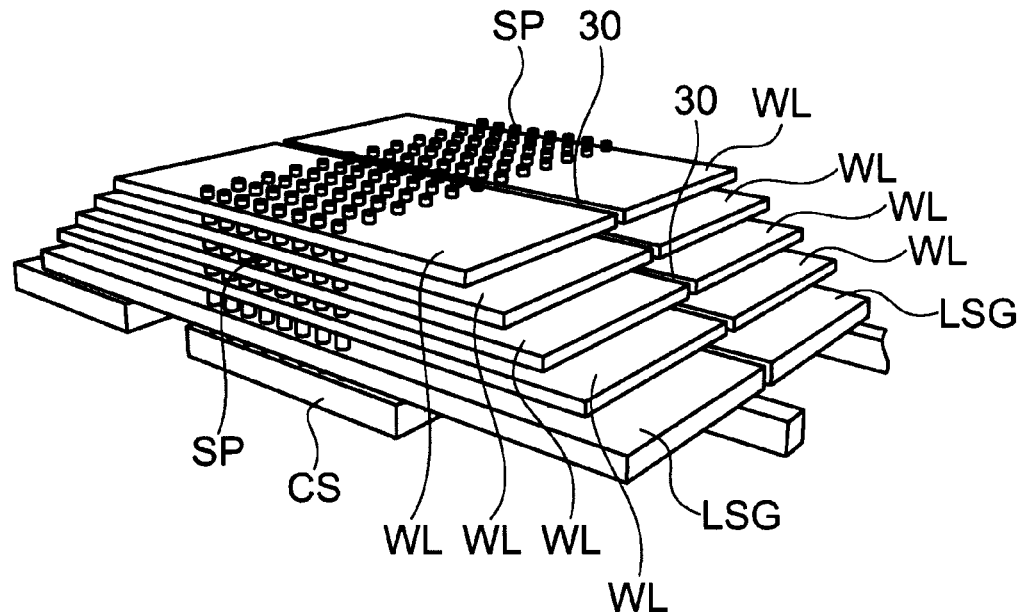
FIGS. 8A and 8B are schematic views showing processes continuing from FIG. 7B.
Figure 8B:
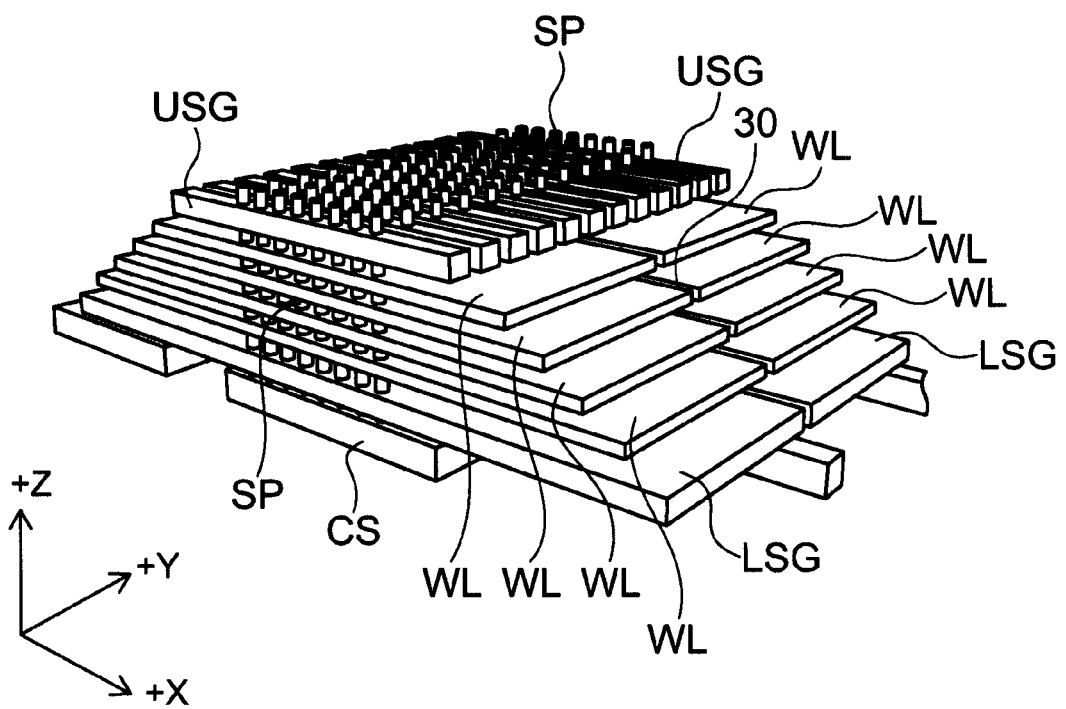

Next, a photoresist film (not shown) is formed on the stacked body ML2 (on the silicon nitride film 32) and patterned into a rectangular shape, for instance. Then, the process of patterning the dielectric films 14 and the conductive films WL by RIE using the photoresist film as a mask, the process of ashing (slimming) the photoresist film to downsize its outline, the process of patterning the dielectric films 14 and the conductive films WL by using the slimmed photoresist film as a mask, the process of further slimming the photoresist film, and so on, are repeated to pattern the end portion of the stacked body of the dielectric films 14 and the conductive films WL into a staircase shape as shown in FIGS. 8A and 11.

Figure 11A:
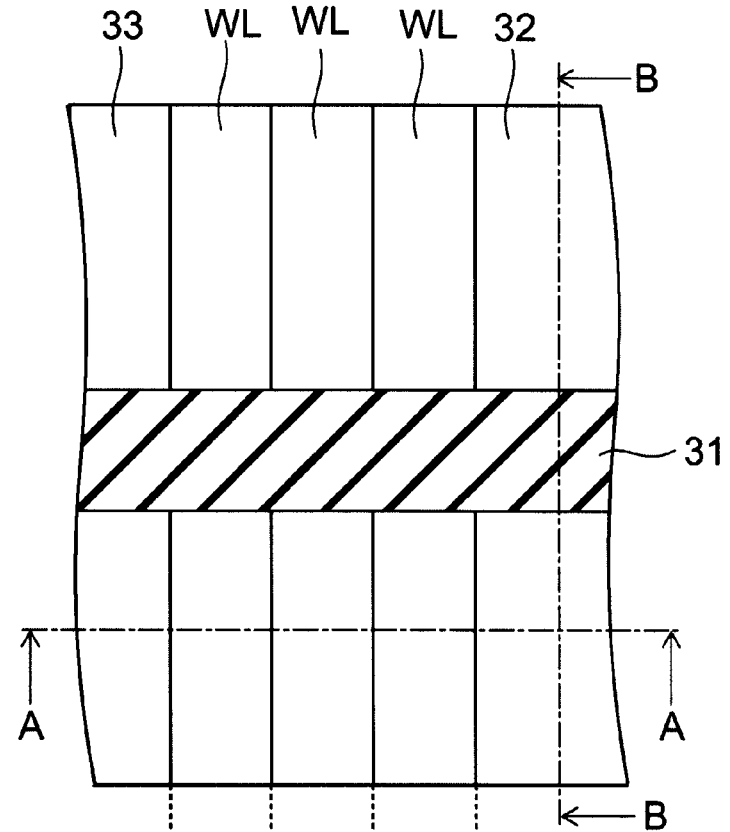
FIGS. 11A and 11B are schematic views of a staircase-shaped portion of the stacked body in FIG. 8A.
Figure 11B:
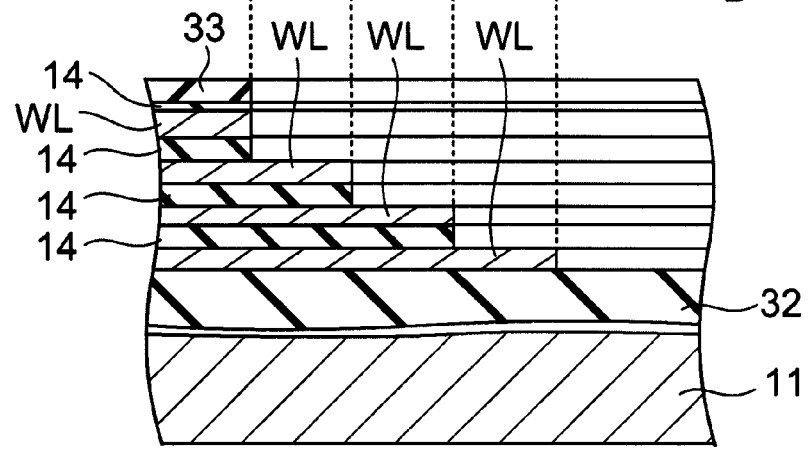
Figure 12:
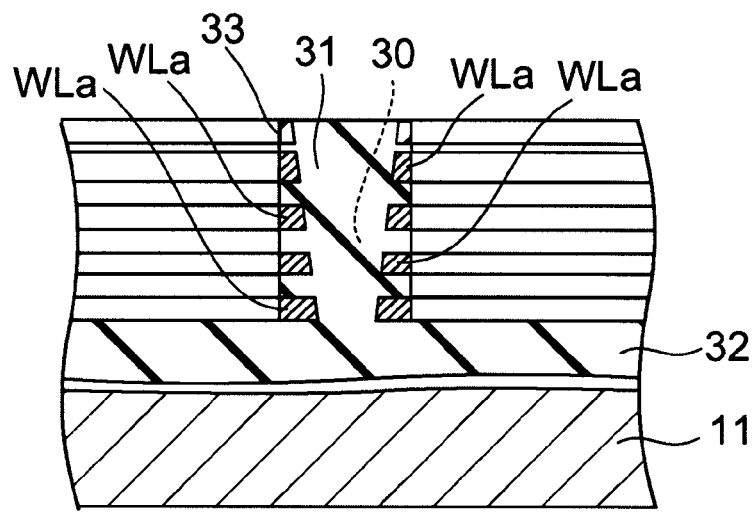
FIG. 12 is a B-B cross sectional view in FIG. 11A.

FIG. 11A is a schematic plan view of the aforementioned staircase-shaped portion, and FIG. 11B is an A-A cross-sectional view in FIG. 11A. FIG. 12 is a B-B cross-sectional view in FIG. 11A.

In the aforementioned staircase patterning of the stacked body, the portion including the slit 30 dividing the stacked body into a plurality of blocks and the interlayer dielectric film 31 buried therein is not etched but left as shown in FIG. 12.

The slit 30 is illustratively formed by RIE. Under the current process technology, particularly in the case where the stacked body includes a large number of layers and has a large aspect ratio, the width of the slit 30 is not constant along the depth, but tends to narrow from the upper portion on the opening end side toward the lower (bottom) portion as shown in FIG. 9B.

Hence, if the end portion of the dielectric films 14 and the conductive films WL is etched into a staircase shape as described above, the interlayer dielectric film 31 on the opening end side, where the slit 30 is wide, acts as a mask and prevents the conductive layers WL located therebelow from being etched. Thus, as shown in FIG. 12, a portion WLa of the conductive layer WL remains beside (outside) the sidewall of the slit 30.

Figure 14:
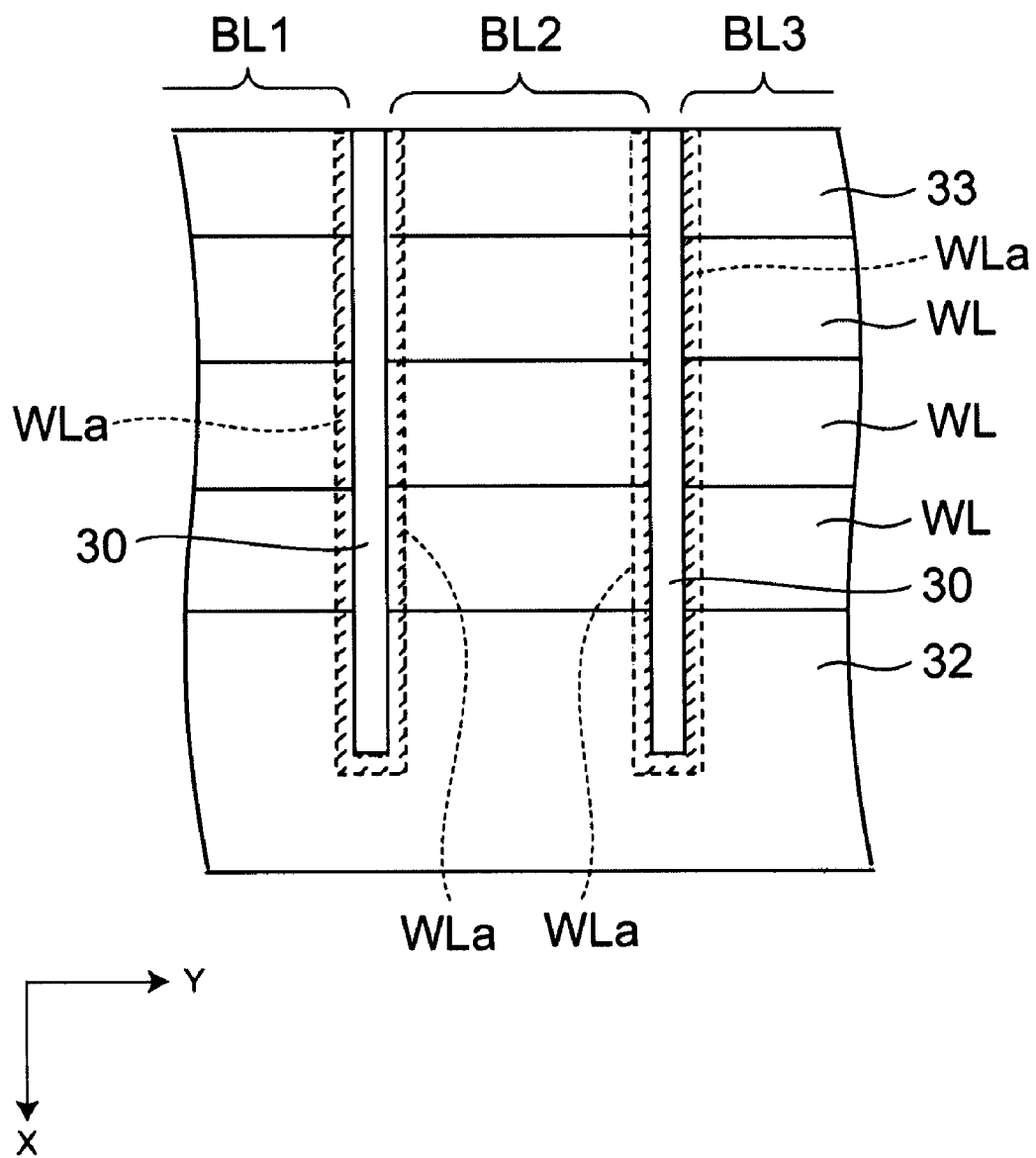
FIG. 14 is a schematic view similar to FIG. 14 in a comparative example.

Here, FIG. 14 shows a pattern layout of a slit 30 in a comparative example corresponding to this embodiment. In FIG. 14, the region where the residual conductive layer WLa exists beside the sidewall of the slit 30 is schematically shown by dashed hatching.

In this comparative example, the slit 30 extends only in the direction crossing (orthogonal to) each end portion of the staircase-shaped conductive layers WL, and the stacked body including the conductive layers WL is divided into blocks BL1-BL3. In such a pattern layout, the residual conductive layer WLa of the block BL1 and the residual conductive layer WLa of the block BL2 are connected through a portion formed so as to circumvent the end portion of the slit 30. Likewise, the residual conductive layer WLa of the block BL2 and the residual conductive layer WLa of the block BL3 are connected through a portion formed so as to circumvent the end portion of the slit 30. That is, in the comparative example shown in FIG. 14, the conductive layers WL of the adjacent blocks across the slit 30 are short-circuited to each other through the residual conductive layer WLa.

Figure 13:
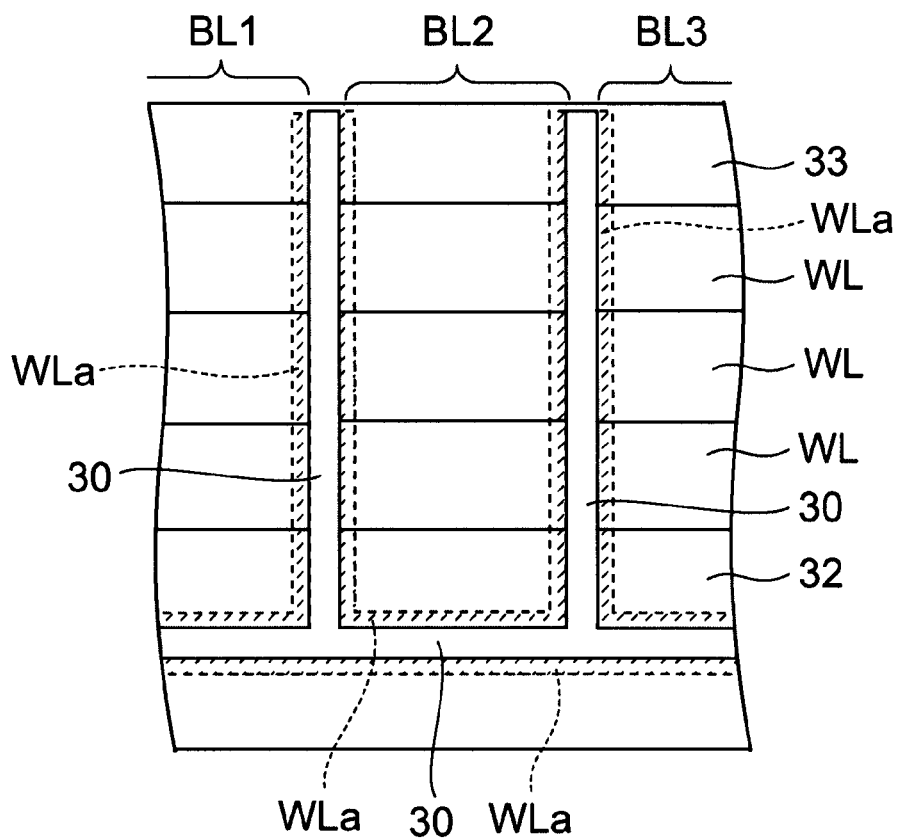
FIG. 13 is a schematic view showing the pattern layout of the slit dividing the memory cell array of the embodiment of the invention into a plurality of blocks.

In contrast, the pattern layout of the slit 30 in this embodiment is shown in FIGS. 1 and 13. Also in FIG. 13, like FIG. 14, the region where the residual conductive layer WLa exists beside the sidewall of the slit 30 is schematically shown by dashed hatching.

In this embodiment, the slit 30 also extends in the direction along the block dividing direction, and each block is surrounded by the slits 30 formed in a closed (closed-loop) pattern. Hence, the residual conductive layer WLa of each block also has a closed-loop pattern which is closed in the block, and avoids connection between the residual conductive layers WLa of the adjacent blocks. Consequently, short circuit of the conductive layers WL between the blocks can be avoided.

After the end portion of the conductive layers WL in the memory cell array is patterned into a staircase shape as described above, as shown in FIG. 15, a barrier layer (such as a silicon nitride film) 35 is deposited on the staircase-shaped portion. Then, an interlayer dielectric film (such as a silicon oxide film) 36 is buried further thereon and planarized by CMP.

Contact holes reaching the end portion of the staircase-shaped conductive layers WL and the lower select gate LSG are formed through the barrier layer 35 and the interlayer dielectric film 36, and a conductive material is buried therein. Thus, the conductive layers WL and the lower select gate LSG are each electrically extracted above through contact portions 65, 64.

The process is further continued. An upper select gate USG is formed via a dielectric layer above the stacked body ML2 in the memory cell array (FIG. 8B), and a dielectric layer is formed further thereon. Thus, the stacked body ML3 shown in FIGS. 4 and 5 is formed.

In the stacked body ML3, through holes extending in the Z direction (stacking direction) to the silicon pillar SP of the stacked body ML2 are etched, and then a dielectric film, such as a silicon oxide film and a silicon nitride film, is deposited entirely on the stacked body ML3. This dielectric film is formed on the bottom surface and side surface of the through hole in addition to the upper surface of the stacked body ML3.

Figure 15:
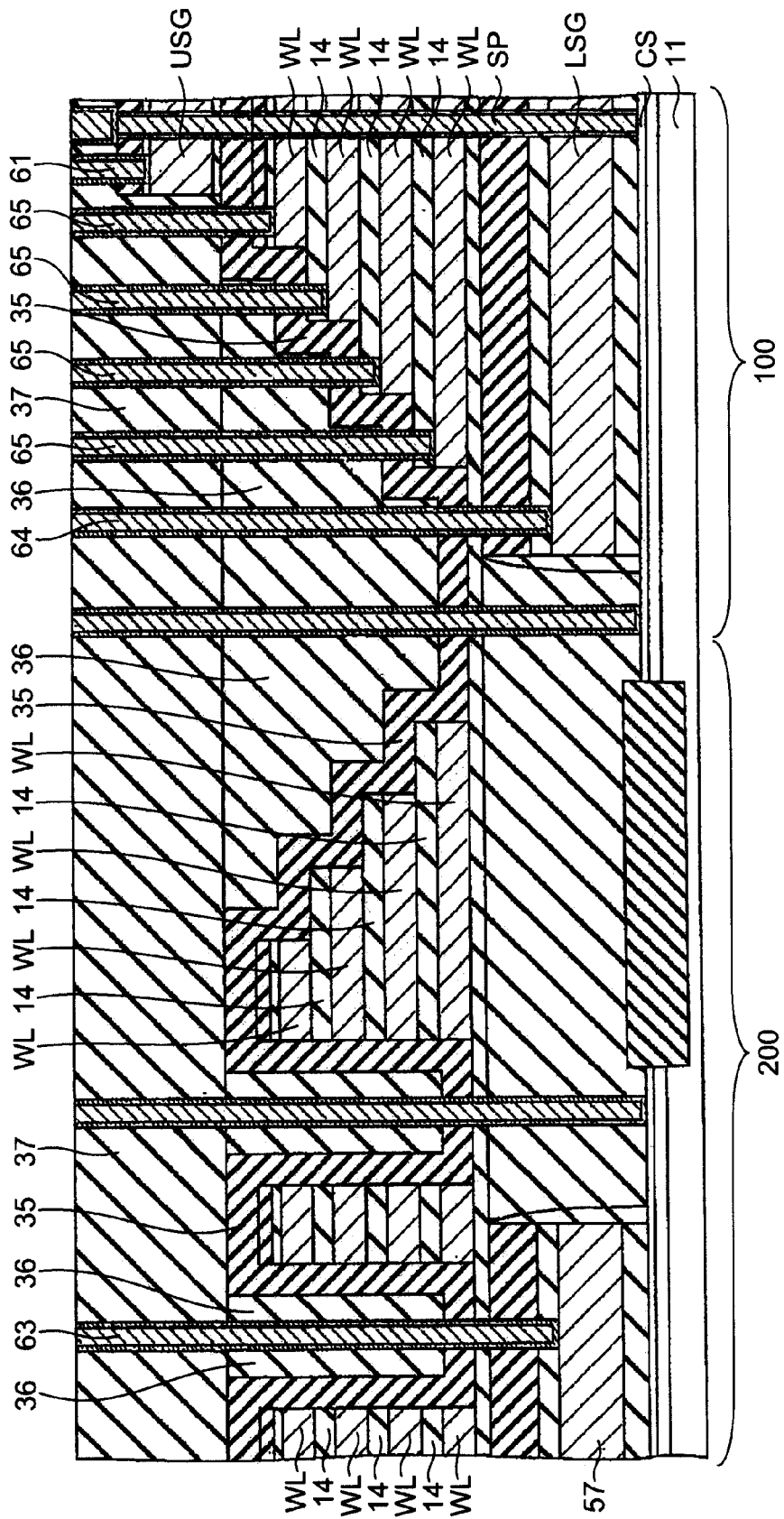
FIG. 15 is a schematic cross-sectional view of the relevant part of the semiconductor memory device according to the embodiment of the invention.

Next, the dielectric film formed on the upper surface of the stacked body ML3 and the bottom surface of the through hole is removed illustratively by RIE. Thus, the dielectric film remains on the side surface of the through hole to serve as a gate dielectric film GD (FIGS. 4 and 5). Next, after the silicon pillar SP of the stacked body ML2 is exposed to the bottom of the through hole, silicon is buried inside the through hole to form a silicon pillar SP in the stacked body ML3. Thus, an upper select transistor UST is formed. The lower end of the silicon pillar SP of the stacked body ML3 is in contact with the upper end of the silicon pillar SP of the underlying stacked body ML2. As shown in FIG. 15, the upper select gate USG is electrically extracted above through a contact portion 61.

Subsequently, by film formation and patterning of a metal material, bit lines BL, upper select gate interconnects USL, word lines WLL, lower select gate interconnects LSL, cell source interconnects CSL and the like are formed. Thus, the structure shown in FIG. 2 is obtained.

The cross-sectional view of FIG. 15 described above also shows part of the peripheral circuit region 200. In FIG. 15, thin hatching represents a conductive layer, and thick hatching represents a dielectric layer.

Like the memory cell array region 100, the peripheral circuit region 200 also includes a stacked body in which a plurality of conductive layers WL and a plurality of dielectric layers 14 are alternately stacked. The stacked body of the conductive layers WL and the dielectric layers 14 is formed entirely on the substrate 11, and the stacked body in the peripheral circuit region 200 is left therein without removal. The stacked body in the peripheral circuit region 200 is a so-called dummy structure for avoiding a large step difference with respect to the memory cell array region 100, and the conductive layer WL in the peripheral circuit region 200 does not function as an electrode or interconnect layer.

The conductive layer 57 in the peripheral circuit region 200 is formed in the same process as the conductive layer constituting the lower select gate LSG in the memory cell array region 100, and functions as the gate electrode of a transistor formed in the peripheral circuit region 200. This gate electrode 57 is electrically extracted above through a contact portion 63 penetrating through the dielectric layers 36, 37, the barrier layer 35 and the like.

As described above, the aforementioned stacked body is provided also in the peripheral circuit region 200. Hence, the stacked body of the conductive layers WL and the dielectric layers 14 is provided also in and around the region including the sense amplifier 4 and the row decoder 5 shown in FIG. 1.

In this embodiment, as shown in FIG. 1, the stacked body around the sense amplifier 4 is also provided with slits 30 in a closed (closed-loop) pattern surrounding the sense amplifier 4. Furthermore, the stacked body around the row decoder 5 is also provided with slits 30 in a closed (closed-loop) pattern surrounding the row decoder 5.

Hence, even if residual conductive layers remain beside the sidewall of the slit 30 as described above, the residual conductive layers in each region of the sense amplifier 4 and the row decoder 5 form a closed-loop pattern. Thus, the residual conductive layers are not connected to those of the memory cell array 3 and other peripheral circuit components.

That is, the embodiment of the invention can avoid short circuit between components through residual conductive layers which may remain beside the sidewall of the slit 30 for insulating and isolating between the components intended to be electrically independent.

Furthermore, slits 30 with an interlayer dielectric film buried therein are formed also immediately inside the dicing line for chip separation and entirely surround the chip in a closed-loop pattern. Even if a crack occurs at the chip edge during dicing, the slit 30 with an interlayer dielectric film buried therein functions as a buffer layer and can prevent the crack from reaching the peripheral circuit or memory cell array located inside. In the aforementioned stacked body, the portion inside the dicing line can also be patterned into a staircase shape like the end portion of the memory cell array. This also serves to prevent cracks from reaching the inner components.

The embodiment of the invention has been described with reference to examples. However, the invention is not limited thereto, but can be variously modified within the spirit of the invention.

The shape of the silicon pillar SP is not limited to a cylinder, but can be a prism. Furthermore, the invention is not limited to burying a silicon pillar entirely in the through hole. As an alternative structure, a silicon pillar can be formed in a tubular shape only at the portion in contact with the ONO film, and a dielectric can be buried inside it. Furthermore, the film structure between the conductive layer WL and the silicon pillar is not limited to the ONO film structure, but can be a two-layer structure of a charge storage layer and a gate dielectric film, for instance.

The invention claimed is:

1. A semiconductor memory device comprising:
  a semiconductor substrate;
  a stacked body including a plurality of conductive layers and a plurality of dielectric layers alternately stacked, the stacked body being provided on the semiconductor substrate;
  a semiconductor layer provided inside a hole formed through the stacked body, the semiconductor layer extending in stacking direction of the conductive layers and the dielectric layers; and
  a charge storage layer provided between the conductive layers and the semiconductor layer,
  the stacked body in a memory cell array region including a plurality of memory strings being divided into a plurality of blocks by slits with an interlayer dielectric film buried therein, the memory string including as many memory cells series-connected in the stacking direction as the conductive layers, each memory cell including the conductive layer, the semiconductor layer, and the charge storage layer provided between the conductive layer and the semiconductor layer, and each of the blocks being surrounded by the slits formed in a closed pattern in a planar view.

2. The device according to claim 1, wherein the slits extend also in dividing direction of the plurality of blocks.

3. The device according to claim 1, wherein the slits have a width narrowing from its opening end side toward its bottom.

4. The device according to claim 1, wherein the memory cells have a charge trap structure.

5. The device according to claim 4, wherein the charge storage layer is a silicon nitride film.

6. The device according to claim 1, further comprising:
a first dielectric film provided between the conductive layer and the charge storage layer.

7. The device according to claim 1, further comprising:
a second dielectric film provided between the charge storage layer and the semiconductor layer.

8. The device according to claim 1, wherein the dielectric layer includes silicon oxide.

9. The device according to claim 1, wherein the conductive layer is a silicon layer.

10. The device according to claim 1, wherein the semiconductor layer is a silicon layer.

11. The device according to claim 1, wherein the interlayer dielectric film includes silicon oxide.

12. The device according to claim 1, wherein the plurality of conductive layers are formed into a staircase shape in an end portion of the memory cell array region.

13. The device according to claim 12, wherein a dielectric film is provided on the staircase-shaped portion of the conductive layers.

14. The device according to claim 13, wherein
a contact hole penetrating through the dielectric film and reaching the staircase-shaped portion of the conductive layers is formed in the dielectric film, and
a conductive material is provided in the contact hole.

15. The device according to claim 1, wherein
a peripheral circuit region is formed around the memory cell array region, and
the stacked body with the plurality of conductive layers and the plurality of dielectric layers alternately stacked is provided also in the peripheral circuit region.

16. The device according to claim 15, wherein
a sense amplifier configured to read data stored in the memory cell is provided in the peripheral circuit region, and
the stacked body around the sense amplifier is also provided with the slits formed in a closed pattern surrounding the sense amplifier.

17. The device according to claim 16, wherein the slits separate the memory cell array region from the sense amplifier.

18. The device according to claim 15, wherein
a row decoder configured to select the conductive layer in the memory cell array region is provided in the peripheral circuit region, and
the stacked body around the row decoder is also provided with the slits formed in a closed pattern surrounding the row decoder.

19. The device according to claim 18, wherein the slits separate the memory cell array region from the row decoder.

20. The device according to claim 1, wherein the slits are also formed immediately inside a dicing line for separating the semiconductor substrate into chips and surround the chip in a closed-loop pattern.

* * * * *